(12) United States Patent
Lee et al.

(10) Patent No.: US 8,441,183 B2
(45) Date of Patent: May 14, 2013

(54) ORGANIC ELECTROLUMINESCENT DEVICE

(75) Inventors: Meng-Ting Lee, Hsin-Chu (TW); Chun-Liang Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/398,959

(22) Filed: Feb. 17, 2012

(65) Prior Publication Data
US 2013/0076235 A1 Mar. 28, 2013

(30) Foreign Application Priority Data
Sep. 28, 2011 (TW) ............................... 100135043 A

(51) Int. Cl.
*H01J 1/62* (2006.01)
(52) U.S. Cl.
USPC ........................................................ 313/504

(58) Field of Classification Search ................... 313/498, 313/504, 506, 512
See application file for complete search history.

(56) References Cited

U.S. PATENT DOCUMENTS

| | | | | |
|---|---|---|---|---|
| 6,777,871 B2 * | 8/2004 | Duggal et al. | ................ | 313/506 |
| 7,245,074 B2 * | 7/2007 | Shiang | ........................... | 313/504 |
| 7,834,541 B2 * | 11/2010 | Cok | ............................... | 313/504 |

* cited by examiner

*Primary Examiner* — Vip Patel
(74) *Attorney, Agent, or Firm* — WPAT, PC; Justin King

(57) ABSTRACT

An organic electroluminescent device includes an optical substrate, a transparent electrode, an organic electroluminescent structure, and a back electrode. The optical substrate includes a base and a plurality of scattering particles. The scattering particles are mixed in the base. The transparent electrode is directly disposed on the optical substrate. The organic electroluminescent structure is disposed on the transparent electrode. The back electrode is disposed on the organic electroluminescent structure.

19 Claims, 4 Drawing Sheets

ORGANIC ELECTROLUMINESCENT DEVICE

RELATED APPLICATIONS

This application claims priority to Taiwan Application Serial Number 100135043, filed Sep. 28, 2011, which is herein incorporated by reference.

BACKGROUND

1. Technical Field

The present disclosure relates to an organic electroluminescent device.

2. Description of Related Art

Many are gradually coming to believe that organic electroluminescent devices have the potential to become a leading technology in the area of flat panel displays and in the lighting industry due to their thin profile, light weight, self-emissive property, ability to eliminate the need for a back light source, unlimited viewing angle, and high response speed.

The luminous efficiency of an organic electroluminescent device may be expressed as follows:

$$\eta_{Power\ efficiency} \propto \frac{\gamma \times \eta_{exciton} \times \eta_{material} \times \eta_{outcoupling}}{V}$$

where $\eta_{Power\ efficiency}$ is the luminous efficiency of the organic electroluminescent device, $\gamma$ is a recombination ratio of hole and electron carriers, $\eta_{exciton}$ is a generation ratio of an exciton, $\eta_{material}$ is a quantum efficiency of material, $\eta_{outcoupling}$ is an extraction efficiency, and V is an operating voltage of the organic electroluminescent device.

From the above formula, it is evident that the extraction efficiency is a key factor in the luminous efficiency of an organic electroluminescent device. However, in an organic electroluminescent device, due to the difference in refraction index between adjacent layers, most of the light (approximately 80%) illuminated from the organic electroluminescent device is lost because of total reflectance. Only some of the light (approximately 20%) can be extracted for illumination purposes.

Therefore, there is a need to enhance the light extraction efficiency of an organic electroluminescent device and thereby raise the luminous efficiency thereof.

SUMMARY

An organic electroluminescent device is provided as an aspect of the invention. The organic electroluminescent device is used to solve the difficulty mentioned in the related art.

According to an embodiment of the present invention, the organic electroluminescent device includes an optical substrate, a transparent electrode, an organic electroluminescent structure and a back electrode. The optical substrate includes a base and a plurality of scattering particles. The scattering particles are mixed in the base. The transparent electrode is directly disposed on the optical substrate. The organic electroluminescent structure is disposed on the transparent electrode. The back electrode is disposed on the organic electroluminescent structure.

In one or a plurality of embodiments of the present invention, the material of the base is a polymer.

In one or a plurality of embodiments of the present invention, a refractive index of the base is greater than approximately 1.5.

In one or a plurality of embodiments of the present invention, a refractive index of the scattering particles is greater than approximately 1.4.

In one or a plurality of embodiments of the present invention, an average diameter of each of the scattering particles is approximately 0.8 to 1 µm.

In one or a plurality of embodiments of the present invention, the optical substrate has a haze, a reflectance, and a transmittance. The haze, the reflectance, and the transmittance of the optical substrate satisfy the following condition:

15%<Haze×R×(R+T)<35%, where Haze is the haze of the optical substrate, R is the reflectance of the optical substrate, and T is the transmittance of the optical substrate.

In one or a plurality of embodiments of the present invention, the optical substrate further includes an outer barrier. The outer barrier is disposed on an outer surface of the base facing away from the transparent electrode.

In one or a plurality of embodiments of the present invention, the outer barrier further is extended to at least a side surface of the base.

In one or a plurality of embodiments of the present invention, the outer barrier further is extended to two opposite side surfaces of the base.

In one or a plurality of embodiments of the present invention, the outer barrier includes an inorganic atomic layer. The inorganic atomic layer is disposed on an outer surface of the base.

In one or a plurality of embodiments of the present invention, the outer barrier includes an inorganic layer and an organic layer. The inorganic layer is disposed on an outer surface of the base. The organic layer is disposed on an outer surface of the inorganic layer facing away from the base.

In one or a plurality of embodiments of the present invention, the above optical substrate further includes an inner barrier. The inner barrier is disposed on an inner surface of the base facing the transparent electrode.

According to another embodiment of the present invention, an organic electroluminescent device includes an optical substrate, a transparent electrode, an organic electroluminescent structure and a back electrode. The optical substrate has a haze, a reflectance, and a transmittance. The haze, the reflectance, and the transmittance of the optical substrate satisfy the following condition:

15%<Haze×R×(R+T)<35%, where Haze is the haze of the optical substrate, R is the reflectance of the optical substrate, and T is the transmittance of the optical substrate.

The transparent electrode is directly disposed on the optical substrate. The organic electroluminescent structure is disposed on the transparent electrode. The back electrode is disposed on the organic electroluminescent structure.

In one or a plurality of embodiments of the present invention, the optical substrate further includes a macromolecule base and a plurality of scattering particles. The scattering particles are mixed in the macromolecule base.

In one or a plurality of embodiments of the present invention, a refractive index of the macromolecule base is greater than approximately 1.5.

In one or a plurality of embodiments of the present invention, a refractive index of the scattering particles is greater than approximately 1.4.

In one or a plurality of embodiments of the present invention, an average diameter of each of the scattering particles is approximately 0.8 to 1 μm.

In one or a plurality of embodiments of the present invention, the above optical substrate further includes an outer barrier. The outer barrier is disposed on an outer surface of the macromolecule base facing away from the transparent electrode.

In one or a plurality of embodiments of the present invention, the outer barrier is further extended to at least a side surface of the macromolecule base.

In one or a plurality of embodiments of the present invention, the optical substrate further includes an inner barrier. The inner barrier is disposed on an inner surface of the macromolecule base facing the transparent electrode.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
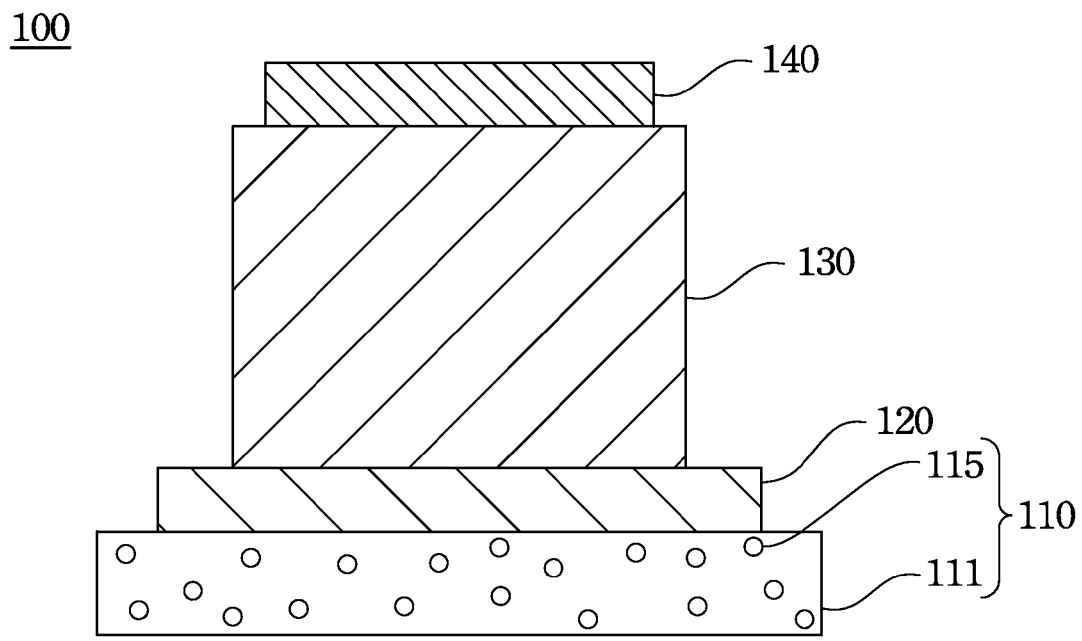
FIG. 1 is a cross section of an organic electroluminescent device according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross section of an organic electroluminescent device 100 according to an embodiment of the invention. In FIG. 1, the organic electroluminescent device 100 includes an optical substrate 110, a transparent electrode 120, an organic electroluminescent structure 130 and a back electrode 140. The optical substrate 110 includes a base 111 and a plurality of scattering particles 115. The scattering particles 115 are mixed in the base 111. The transparent electrode 120 is directly disposed on the optical substrate 110. The organic electroluminescent structure 130 is disposed on the transparent electrode 120. The back electrode 140 is disposed on the organic electroluminescent structure 130.

In a conventional configuration, a glass substrate on which other elements are disposed is used. However, due to differences in refraction indices, light generated by the conventional electroluminescent device will undergo total reflectance at a border between the glass substrate and any element disposed thereon, as well as at a border between the glass substrate and the air. As a result, light loss occurs. In some conventional configurations, the light loss due to total reflectance at these two positions even reaches 60%. Therefore, the embodiment of the invention utilizes the optical substrate 110 instead of a glass substrate. The optical substrate 110 can eliminate total reflectance to raise the extraction efficiency as a result of the fact that the optical substrate 110 is mixed with the scattering particles 115.

In the embodiment, the base 111 of the optical substrate 110 can be a macromolecule base. Namely, the material of the base 111 can be a polymer, e.g., polyethylene terephthalate (PET), polyethylene naphthalate (PEN), polycarbonate (PC), polyimide (PI), silicone, or any combination thereof.

Moreover, a refractive index of the transparent electrode 120 is about 2.0. Therefore, a refractive index of the base 111 is generally as close to 2.0 as possible to lower the possibility of total reflectance occurring. In some embodiments of the invention, the refractive index of the base 111 is greater than approximately 1.5.

In addition, the transmittance of the base 111 is greater than approximately 80%. A thickness of the base 111 is approximately 0.1 to 1 mm. It should be understood that details such as the material, optical characteristics and dimensions of the base 111 are mentioned by way of example, and do not limit the invention. Persons skilled in the art may select such aspects of the base 111 in a flexible manner and depending on actual requirements.

In the embodiment, the material of the scattering particles 115 can be titanium dioxide, zinc Oxide, yttrium(III) oxide, terbium-yttrium-aluminum garnet, aluminum oxide, silicon dioxide, silicon monoxide, calcium carbonate, barium sulfate, zirconium dioxide or any combination thereof. Moreover, the refractive index of the scattering particles 115 is greater than approximately 1.4 or 1.5. An average diameter of the scattering particles 115 is approximately 0.08 to 5 μm or 0.8 to 1 μm. As in the case of the base 111, details such as the material, optical characteristic and dimensions of the scattering particles 115 are mentioned by way of example, and do not limit the invention. Persons skilled in the art may select such aspects of the scattering particles 115 in a flexible manner and depending on actual requirements.

During manufacture, manufacturers can mix the scattering particles 115 with the base 111 in a liquid phase. The concentration is approximately 1 to 10 wt %. Subsequently, manufacturers can coat a mixture of the base 111 and the scattering particles 115 on a carrier to solidify, and thereby obtain the optical substrate 110 according to FIG. 1.

In practice, manufacturers can adjust all parameters of the base 111 and scattering particles 115 to make the haze, the reflectance, and the transmittance of the optical substrate satisfy the following condition:

$$15\% < Haze \times R \times (R+T) < 35\%,$$

where Haze is the haze of the optical substrate 110, R is the reflectance of the optical substrate 110, and T is the optical transmittance within the total spectrum of the optical substrate 110.

Figure 2:
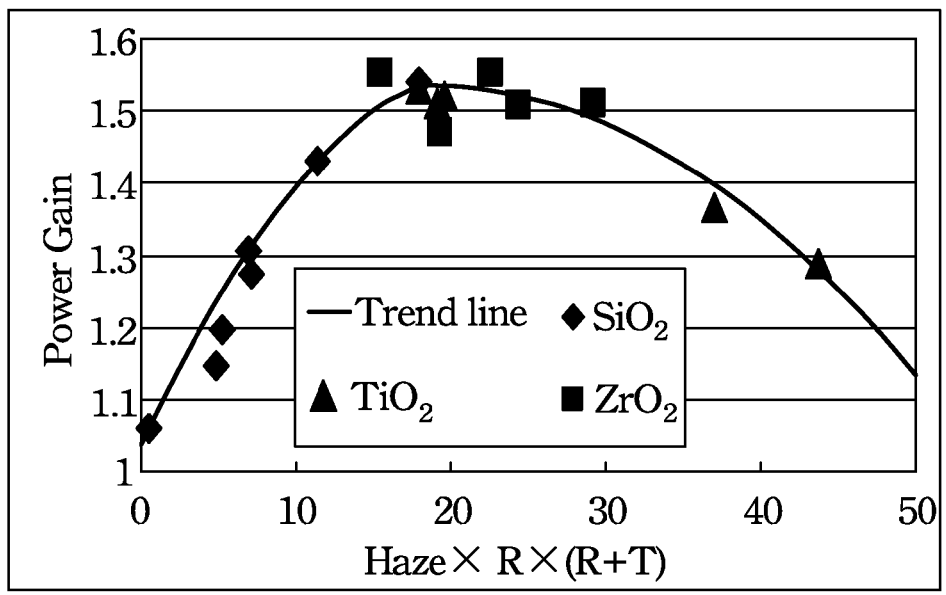
FIG. 2 is a graph illustrating Haze×R×(R+T) as a function of power gain according to a plurality of examples of the invention.

FIG. 2 is a graph illustrating Haze×R×(R+T) as a function of power gain according to a plurality of examples of the invention. In FIG. 2, power gain is a dimensionless relative value, and represents the power gain of the organic electroluminescent device 100 utilizing the optical substrate 110 compared to the power gain of an organic electroluminescent device utilizing a glass substrate when all the other conditions are the same. In the graph, ♦ represents an example in which the scattering particles 115 are made of silicon dioxide, ▲ represents an example in which the scattering particles 115 are made of titanium dioxide, and ■ represents an example in which the scattering particles 115 are made of zirconium dioxide. It can be seen clearly in FIG. 2 that when the value range of Haze×R×(R+T) is 15%~35%, the power gain reaches greater than approximately 1.5 for the most part.

It should be understood that in the embodiment, the haze of the optical substrate 110 is defined as follows:

$$\text{Haze}=[T-T0]/T$$

where Haze is the haze of the optical substrate 110, T is the transmittance of the optical substrate 110, and T0 is the optical transmittance within a partial spectrum of the optical substrate 110 in the ±5° range of the optical substrate 110 normal direction.

Figure 3:
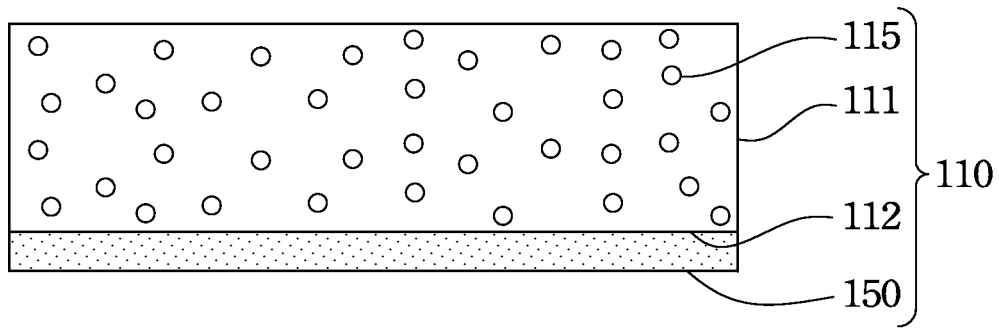
FIG. 3 is a cross section of an optical substrate according to another embodiment of the invention.

FIG. 3 is a cross section of the optical substrate according to another embodiment of the invention. In this embodiment, the optical substrate 110 includes at least one outer barrier 150. The outer barrier 150 is disposed on an outer surface 112 of the base 111 facing away from the transparent electrode to protect against water and oxygen intruding into the organic electroluminescent device.

Figure 4:
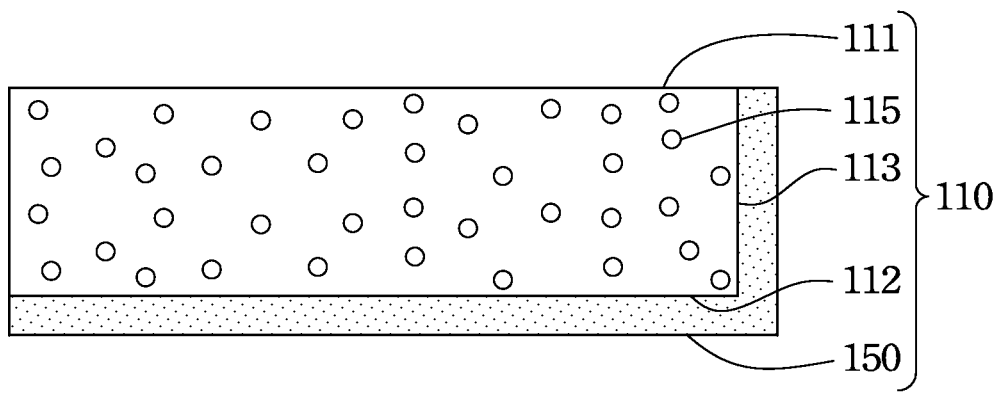
FIG. 4 is a cross section of the optical substrate according to yet another embodiment of the invention.
Figure 5:
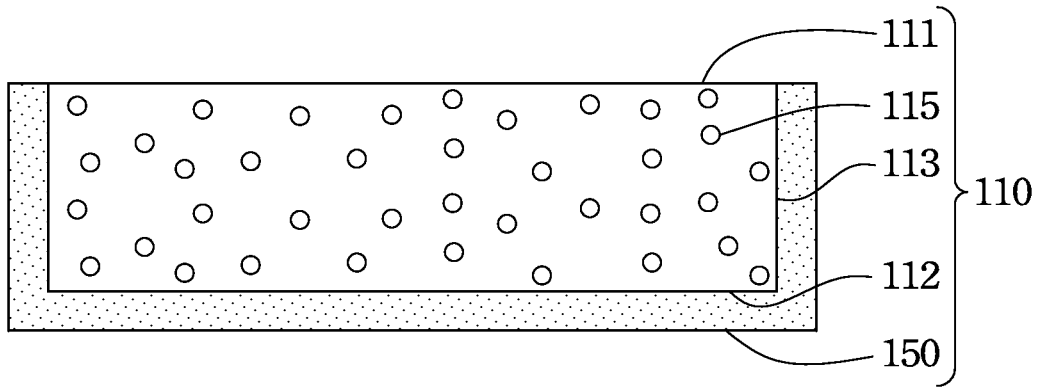
FIG. 5 is a cross section of the optical substrate according to still yet another embodiment of the invention.

FIG. 4 is a cross section of the optical substrate according to yet another embodiment of the invention. In this embodiment, the outer barrier 150 is not only disposed on the outer surface 112 of the base 111, but also extends to a side surface 113 of the base 111. In FIG. 4, although the outer barrier 150 extends only to the side surface 113 of the base 111, the invention is not limited in this regard. In another embodiment, the outer barrier 150 can also extend to two opposite side surfaces of the base 111, as shown in FIG. 5.

In the above embodiments, the outer barrier 150 can be a single inorganic atomic layer. The single inorganic atomic layer can be manufactured by applying an atomic layer deposit. Namely, manufacturers can electroplate inorganic substances (e.g., metal oxide, aluminum oxide, silicon dioxide, and silicon nitride) on one or more surfaces of the base 111 to form the outer barrier 150 using a single atomic membrane deposit process.

Figure 6:
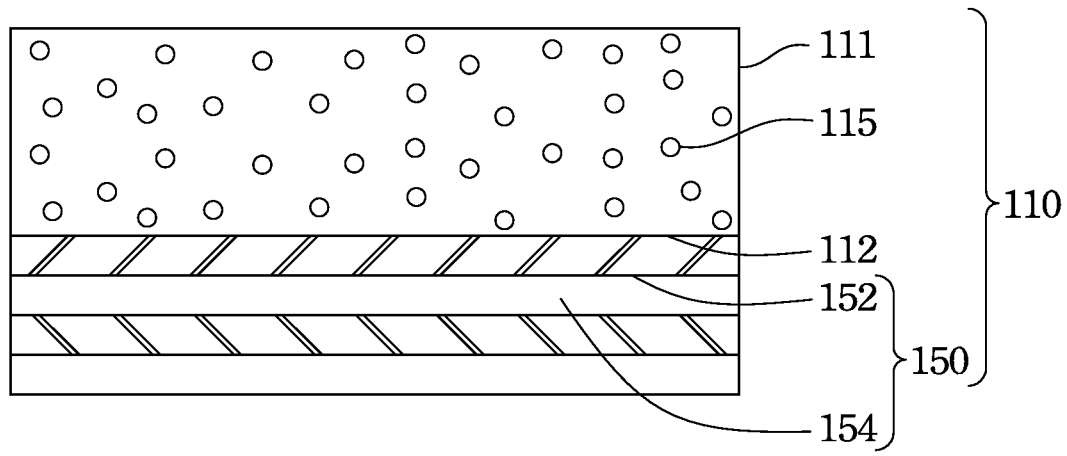
FIG. 6 is a cross section of the optical substrate according to still yet another embodiment of the invention.

FIG. 6 is a cross section of the optical substrate 110 according to still yet another embodiment of the invention. The difference between this embodiment and the embodiments mentioned above is that the outer barrier 150 of this embodiment includes at least one inorganic layer 152 and at least one organic layer 154. The inorganic and organic layers 152, 154 are alternately stacked on the outer surface 112 of the base 111. Taking the inorganic layer 152 and the organic layer 154 which are closest to the base 111 as an example, the inorganic layer 152 is disposed on the outer surface 112 of the base 111, and the organic layer 154 is disposed on an outer surface of inorganic layer 152 facing away from the base 111.

In this embodiment, in view of the fact that an inorganic atomic layer is not easy to manufacture, manufacturers can firstly electroplate the inorganic layer 152, then electroplate the organic layer 154 to make smooth the optical substrate 110. The inorganic layer 152 can be any material capable of resisting water and oxygen, e.g., metal-oxide, aluminum oxide, silicon dioxide, and silicon nitride. The organic layer 154 can be any material capable of making smooth the optical substrate 110, e.g., macromolecule, poly (methyl methacrylate) (PMMA), etc.

Figure 7:
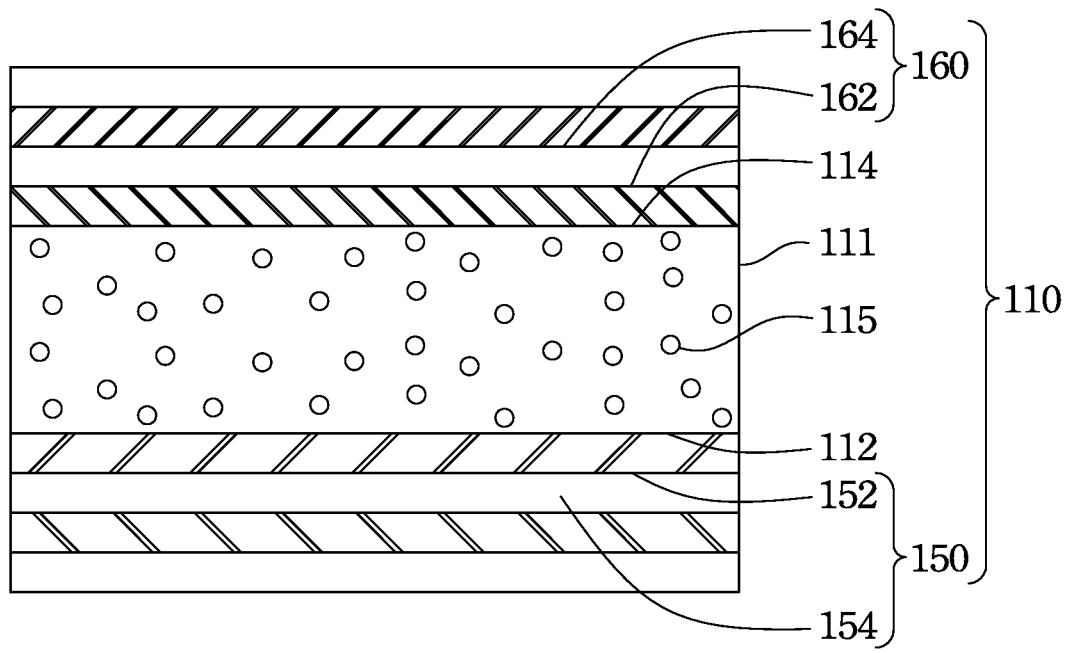
FIG. 7 is a cross section of the optical substrate according to still yet another embodiment of the invention.

FIG. 7 is a cross section of the optical substrate according to still yet another embodiment of the invention. In this embodiment, the optical substrate 110 can include at least one inner barrier 160. The inner barrier 160 is disposed on the inner surface 114 of the base 111 facing the transparent electrode to prevent water and oxygen from intruding into the organic electroluminescent device.

As in the case of the above embodiment, the inner barrier 160 of this embodiment includes at least one inorganic layer 162 and at least one organic layer 164. The inorganic and organic layers 162, 164 are alternately stacked on the inner surface 114 of the base 111. Taking the inorganic layer 162 and the organic layer 164 which are closest to the base 111 as an example, the inorganic layer 162 is disposed on the inner surface 114 of the base 111, and the organic layer 164 is disposed on an inner surface of the inorganic layer 162 facing away from the base 111. The inorganic layer 162 can be any material capable of resisting water and oxygen, e.g., metal-oxide, aluminum oxide, silicon dioxide, and silicon nitride. The organic layer 164 can be any material capable of making smooth the optical substrate 110, e.g., macromolecule, poly (methyl methacrylate) (PMMA), etc.

It should be understood that although the inner barrier 160 is shown in FIG. 7 as being formed as a stacked layer including the inorganic layer 162 and the organic layer 164, manufacturers can manufacture the inner barrier 160 as a single inorganic atomic layer as needed. Furthermore, although the optical substrate 110 has the inner barrier 160 and the outer barrier 150 as shown in FIG. 7, in practice, the optical substrate 110 may only include the inner barrier 160. Persons skilled in the art may select such aspects of the inner barrier 160 in a flexible and depending on actual requirements.

Referring back to FIG. 1, the transparent electrode 120 can be an anode in practice. The material of the transparent electrode 120 can be indium tin oxide, indium zinc oxide, aluminum zinc oxide or any combination thereof. It should be understood that details such as the material, optical characteristics and dimensions of the transparent electrode 120 are mentioned by way of example, and do not limit the invention. Persons skilled in the art may select such aspects of the transparent electrode 120 in a flexible manner and depending on actual requirements.

In the embodiment, the organic electroluminescent structure 130 can include a hole transporting layer (HTL), an organic emitting layer (EL), an electron transporting layer (ETL), and an electron injection layer (EIL), in which these four layers are stacked on the transparent electrode 120 in this order. The hole transporting layer (HTL), for example, can be N,N'-diphenyl-N,N'-bis(1-naphthyl)-(1,1'-biphenyl)-4,4'-diamine (NPB). The organic emitting layer (EL), for example, can be N,N'-diphenyl-N,N'-bis(1-naphthyl)-(1,1'-biphenyl)-4,4'-diamine (NPB), mixed with Rubrene (5,6,11,12-Tetraphenylnaphthacene), or 9,10-dinaphthylanthracene (ADN) mixed with Tetra(t-butyl)perylene (TBP). The electron transporting layer (ETL), for example, can be 4,7-diphenyl-1,10-phenanthroline (Bphen). The electron injection layer (EIL), for example, can be Lithium fluoride.

The back electrode 140 in FIG. 1 can be used as a cathode in practice. The material of the back electrode 140 can be metal, e.g., aluminum or silver. It should be understood that details such as the material, optical characteristics and dimensions of the back electrode 140 are mentioned by way of example, and do not limit the invention. Persons skilled in the art may select such aspects of the back electrode 140 in a flexible manner and depending on actual requirements.

Example

The following paragraphs disclose experimental data of the embodiments of the invention, and are used to explain the enhanced extraction efficiency of the organic electroluminescent device 100 of the embodiments. It should be understood that the following description does not repeat aspects of the embodiments described above, and instead provides additional information to further define the embodiments.

In the following examples and comparative examples, example 1 is the organic electroluminescent device 100 manufactured according to the embodiments mentioned above. The cross section of the organic electroluminescent device 100 of example 1 is shown in FIG. 1. In example 1, the haze of the optical substrate 110 is 94.4%, the transmittance of the optical substrate 110 is 70%, and the reflectance of the optical substrate 110 is 30%. The material of the transparent electrode 120 is indium tin oxide. The thickness of the transparent electrode 120 is 150 nm. The organic electroluminescent structure 130 includes a hole transporting layer, a yellow organic emitting layer, a blue organic emitting layer, an electron transporting layer and an electron injection layer, in which these five layers are stacked on the transparent electrode 120 in order. The material of the hole transporting layer is N,N'-diphenyl-N,N'-bis(1-naphthyl)-(1,1'-biphenyl)-4,4'-diamine (NPB). The thickness of the hole transporting layer is 45 nm. The material of the yellow organic emitting layer is N,N'-diphenyl-N,N'-bis(1-naphthyl)-(1,1'-biphenyl)-4,4'-diamine (NPB) mixed with 1 wt % Rubrene (5,6,11,12-Tetraphenylnaphtacene). The thickness of the yellow organic emitting layer is 4 nm. The material of the blue organic emitting layer is 9,10-dinaphthylanthracene (ADN) mixed with 3 wt % Tetra(t-butyl)perylene (TBP). The thickness of the blue organic emitting layer is 10 nm. The material of the electron transporting layer is 4,7-diphenyl-1,10-phenanthroline (Bphen). The thickness of the electron transporting layer is 30 nm. The material of the electron injection layer is lithium fluoride. The thickness of the electron injection layer is 0.5 nm. The material of the back electrode 140 is aluminum. The thickness of the back electrode 140 is 80 nm.

Figure 8:
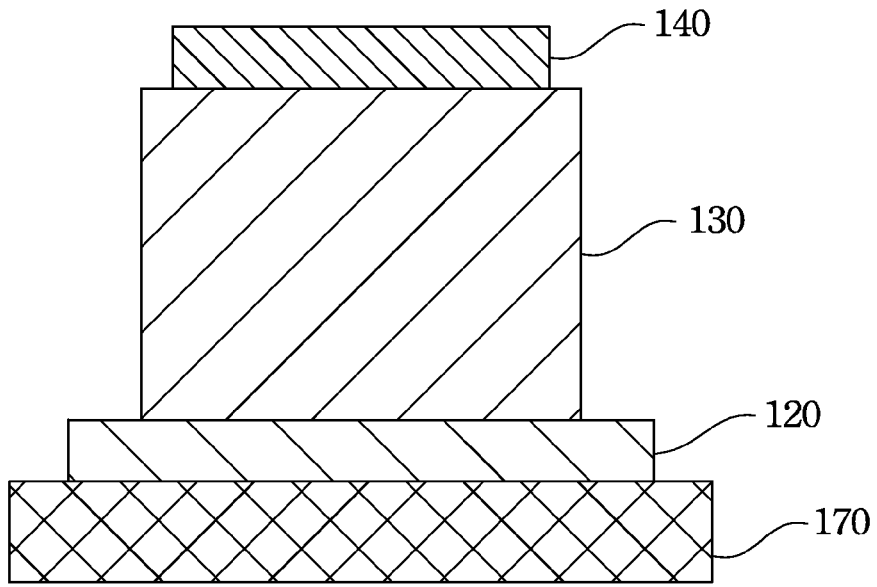
FIG. 8 is a cross section of an organic electroluminescent device according to comparative example 1.

FIG. 8 is a cross section of an organic electroluminescent device according to comparative example 1. In comparative example 1, the glass substrate 170 replaces the optical substrate 110. The material and dimensions of the transparent electrode 120, the organic electroluminescent structure 130 and the back electrode 140 are the same as those for example 1.

Figure 9:
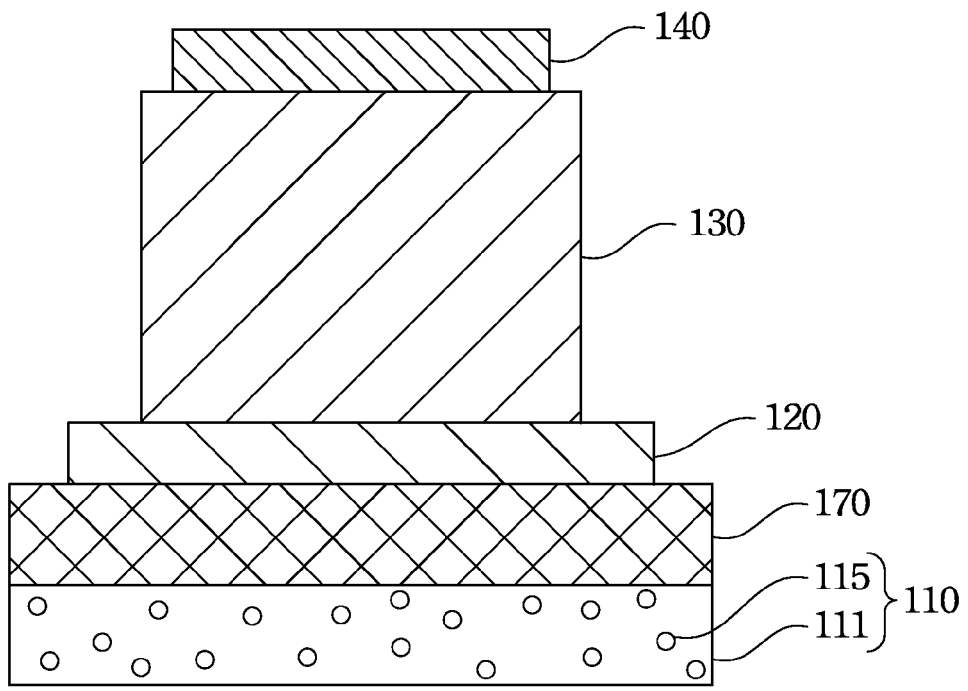
FIG. 9 is a cross section of an organic electroluminescent device according to comparative example 2.

FIG. 9 is a cross section of the organic electroluminescent device according to comparative example 2. In comparative example 2, a stacking layer of the optical substrate 110 and the glass substrate 170 is used as the base for supporting the transparent electrode 120, the organic electroluminescent structure 130 and the back electrode 140. The material and dimensions of the transparent electrode 120, the organic electroluminescent structure 130 and the back electrode 140 are the same as those for example 1

Table 1 shows the luminosity of example 1, comparative example 1, and comparative example 2 when the same current density is used.

TABLE 1

Luminosity of example 1, comparative example 1, and comparative example 2 when same current density used

| | Operating current density (mA/cm$^2$) | luminosity (cd/m$^2$) | Luminous color (CIE 1931 (x, y)) |
|---|---|---|---|
| Example 1 | 20 | 3300 | (0.42, 0.41) |
| Comparative example 1 | 20 | 1920 | (0.40, 0.42) |
| Comparative example 2 | 20 | 2688 | (0.40, 0.42) |

It can be seen in Table 1 that the luminosity of example 1 is markedly higher than that of comparative example 1 by 71.875% (a power gain of 1.71875) and higher than that of comparative example 2 by 22.768% (a power gain of 1.22768).

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An organic electroluminescent device comprising:
   an optical substrate comprising:
      a base; and
      a plurality of scattering particles mixed in the base, wherein the optical substrate has a haze, a reflectance, and a transmittance, and the haze, the reflectance, and the transmittance of the optical substrate satisfy the following condition:

$15\% < Haze \times R \times (R+T) < 35\%$, where Haze is the haze of the optical substrate, R is the reflectance of the optical substrate, and T is the transmittance of the optical substrate;
   a transparent electrode directly disposed on the optical substrate;
   an organic electroluminescent structure disposed on the transparent electrode; and
   a back electrode disposed on the organic electroluminescent structure.

2. The organic electroluminescent device of claim 1, wherein the material of the base is a polymer.

3. The organic electroluminescent device of claim 1, wherein a refractive index of the base is greater than approximately 1.5.

4. The organic electroluminescent device of claim 1, wherein a refractive index of the plurality of scattering particles is greater than approximately 1.4.

5. The organic electroluminescent device of claim 1, wherein an average diameter of each of the scattering particles is approximately 0.8 to 1 μm.

6. The organic electroluminescent device of claim 1, wherein the optical substrate further comprises:
   an outer barrier disposed on an outer surface of the base facing away from the transparent electrode.

7. The organic electroluminescent device of claim 6, wherein the outer barrier is further extended to at least a side surface of the base.

8. The organic electroluminescent device of claim 6, wherein the outer barrier is further extended to two opposite side surfaces of the base.

9. The organic electroluminescent device of claim 6, wherein the outer barrier comprises:
   an inorganic atomic layer disposed on an outer surface of the base.

10. The organic electroluminescent device of claim 6, wherein the outer barrier comprises:
    an inorganic layer disposed on an outer surface of the base; and
    an organic layer disposed on an outer surface of the inorganic layer facing away from the base.

11. The organic electroluminescent device of claim 1, wherein the optical substrate further comprises:
    an inner barrier disposed on an inner surface of the base facing the transparent electrode.

12. An organic electroluminescent device comprising:
an optical substrate, wherein the optical substrate has a haze, a reflectance, and a transmittance, and the haze, the reflectance, and the transmittance of the optical substrate satisfy the following condition:

$$15\% < Haze \times R \times (R+T) < 35\%,$$

where Haze is the haze of the optical substrate, R is the reflectance of the optical substrate, and T is the transmittance of the optical substrate;
a transparent electrode directly disposed on the optical substrate;
an organic electroluminescent structure disposed on the transparent electrode; and
a back electrode disposed on the organic electroluminescent structure.

13. The organic electroluminescent device of claim 12, wherein the optical substrate comprises:
a macromolecule base; and
a plurality of scattering particles mixed in the macromolecule base.

14. The organic electroluminescent device of claim 13, wherein a refractive index of the macromolecule base is greater than approximately 1.5.

15. The organic electroluminescent device of claim 13, wherein a refractive index of the plurality of scattering particles is greater than approximately 1.4.

16. The organic electroluminescent device of claim 13, wherein an average diameter of each of the scattering particles is approximately 0.8 to 1 μm.

17. The organic electroluminescent device of claim 13, wherein the optical substrate further comprises:
an outer barrier disposed on an outer surface of the macromolecule base facing away from the transparent electrode.

18. The organic electroluminescent device of claim 17, wherein the outer barrier is further extended to at least a side surface of the macromolecule base.

19. The organic electroluminescent device of claim 13, wherein the optical substrate further comprises:
an inner barrier disposed on an inner surface of the macromolecule base facing the transparent electrode.

* * * * *